(12) United States Patent
Ozoe

(10) Patent No.: US 6,297,991 B1
(45) Date of Patent: Oct. 2, 2001

(54) NONVOLATILE SEMICONDUCTOR MEMORY DEVICE

(75) Inventor: Hidetoshi Ozoe, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/644,471

(22) Filed: Aug. 23, 2000

(30) Foreign Application Priority Data

Aug. 26, 1999 (JP) .................................................. 11-239416

(51) Int. Cl.[7] ...................................................... G11C 16/06
(52) U.S. Cl. .................................. 365/185.23; 365/185.28
(58) Field of Search ........................ 365/185.23, 185.28, 365/185.21, 185.2, 185.29

(56) References Cited

U.S. PATENT DOCUMENTS

| 5,519,656 | * | 5/1996 | Maccarrone et al. ........... 365/185.09 |
| 5,706,240 | * | 1/1998 | Fiocchi et al. ........................ 365/226 |
| 5,748,534 | * | 5/1998 | Dunlap et al. ................... 365/185.21 |
| 6,111,791 | * | 8/2000 | Ghilardelli ...................... 365/185.28 |

* cited by examiner

*Primary Examiner*—Amir Zarabian
*Assistant Examiner*—Anh Phung

(57) ABSTRACT

A flash memory includes a programming section for programming one or more of memory cells at a time. The output node of the undoped programming transistor in the programming section is maintained at substantially constant irrespective of the number of the cell transistors being programmed at a time. The programming section has a voltage follower scheme including a differential amplifier and the programming transistor.

5 Claims, 4 Drawing Sheets

NONVOLATILE SEMICONDUCTOR MEMORY DEVICE

BACKGROUND OF THE INVENTION (a) Field of the Invention

The present invention relates to a nonvolatile semiconductor memory device and, more particularly, to the structure of a programming circuit in the nonvolatile semiconductor memory device.

(b) Description of the Related Art

Flash memory is known as a typical nonvolatile semiconductor memory device, wherein each memory cell includes a MOSFET having a floating gate for programming of the memory cell.

FIG. 1 shows a conventional flash memory, which includes a programming section 201, a memory cell array 203 and a selector section 202. The programming section 201 includes voltage divider 210 including resistors R21 and R22 for dividing source potential VPP, an n-channel undoped MOSFET (nMOSFET) Tr21 having a gate coupled to an output node of the voltage divider 210. The memory cell array 203 includes a plurality of memory cells arranged in a matrix and each implemented by a single cell transistor Tr26 ... Tr29. The cell transistor Tr26 ... Tr29 has a source connected to the ground, a drain connected to a corresponding bit line B21 ... B24 extending in the column direction, and a gate connected to a corresponding word line W2 extending in the row direction. The selector section 202 includes a plurality of p-channel MOSFETs (pMOSFETs) Tr22 to Tr25 each corresponding to a bit line B21 ... B24 for selection thereof.

The potential of node C2 connecting the resistors R1 and R2 together is applied as a reference potential to the gate of nMOSFET Tr21, which delivers a programming voltage from the source through node A2. Since the undoped nMOSFET Tr21 has a threshold voltage of zero volt, the potential of node A2 is substantially equal to the reference potential at node C2.

In a programming operation of a cell transistor Tr26, for example, a high voltage is applied to the word line W2, and the gate potential Y21 of pMOSFET Tr22 is set below the potential of node A2 minus the absolute value of the threshold voltage VTP2 of pMOSFET Tr22 to turn on the pMOSFET Tr22, whereby the drain of the cell transistor Tr26 is applied with the programming voltage. Thus, cell transistor Tr26 is turned on to pass the drain current, whereby hot electrons are generated in the vicinity of the drain of the cell transistor Tr26 to be injected into the floating gate of the cell transistor Tr26 for programming. At this stage, although the potential of node A2 is lowered by a product of the on-resistance of the undoped nMOSFET Tr21 and the drain current of the cell transistor Tr26, the potential of node A2 resides substantially at the specified setting voltage due to the small on-resistance of the undoped nMOSFET Tr21, whereby a desired programming speed is obtained.

Assuming that the undoped nMOSFET Tr21 operates in a saturated state, the drain current Ids thereof is expressed by:

$$Ids=(1/2)\beta(W/L)Vgs^2.$$

wherein $\beta$, W, L and Vgs are a constant, gate width, gate length and the source-to-gate voltage of the undoped nMOSFET. The drain current Ids is set at a maximum programming current and $\beta$ is determined by the fabrication process. The potential of node A2 is determined as the desired programming voltage for programming the cell transistors. Since the source-to-gate voltage Vgs is equal to the potential of node C2 minus the potential of node A2, the ratio of W/L for the undoped nMOSFET Tr21 can be determined based on the maximum drain current or the maximum programming current.

On the other hand, in a programming operation for a row or group of the cell transistors Tr26 to Tr29 at a time, the potential of word line W2 is set at a high voltage, the potentials Y21 to Y24 of the gates of pMOSFETs Tr22 to Tr25 are set below the potential of node A2 minus the absolute value of the threshold voltage VTP2 of pMOSFETs Tr22 to Tr25 to turn on the pMOSFETs Tr22 to Tr25, whereby the drains of the cell transistors Tr26 to Tr29 are applied with the programming voltage.

Thus, cell transistors Tr26 to Tr29 are turned on to pass the drain currents, whereby hot electrons are generated in the vicinities of the drains of the cell transistors Tr26 to Tr29 to be injected into the floating gates of the cell transistors Tr26 to Tr29 for programming.

FIG. 2 shows the potential of node A2 at this stage as well as the potentials of other nodes. The potential of node A2 is lowered by a product of the on-resistance of undoped nMOSFET Tr21 and the sum IWO of the drain currents of the cell transistors Tr26 to Tr29. The reduction of the potential of node A2 by Vgs with respect to the potential of node C2 causes that the programming voltage is lower than the critical voltage WX which allows safe programming of the cell transistor.

More specifically, although the on-resistance of the undoped nMOSFET Tr21 is set at a low value, the potential of node A2 is lowered below the critical voltage due to the drain currents of the cell transistors Tr26 to Tr29. This lowers the programming speed of the cell transistors Tr26 to Tr29 compared to the case of programming of the single cell transistor Tr26. This may be called an inherent problem involved in the output voltage supplied from a source follower scheme.

SUMMARY OF THE INVENTION

It is therefore an object of the present invention to provide a nonvolatile semiconductor memory device which is capable of being programmed substantially without lowering the programming speed in the case of programming a plurality of cell transistors at a time compared to a case of programming a single cell transistor.

The present invention provides a nonvolatile semiconductor memory device including a memory cell array having an array of nonvolatile memory cells each including a cell transistor, a bit line disposed for each column of the memory cells for supplying source current to the cell transistors of a corresponding column of the memory cells, a word line disposed for each row of the memory cells for activating the cell transistors of a corresponding row of the memory cells, a selector section for selecting one or plurality of the memory cells for programming, and a programming section including a programming transistor having an output node for supplying programming current to the bit lines, the output node assuming a substantially constant potential irrespective of a number of the memory cells being programmed at a time.

In accordance with the present invention, since the potential of the output node of the programming section is maintained substantially at a constant irrespective of the number of memory cells being programmed at a time, the programming speed can be maintained substantially constant.

The above and other objects, features and advantages of the present invention will be more apparent from the following description, referring to the accompanying drawings.

PREFERRED EMBODIMENT OF THE INVENTION

Now, the present invention is more specifically described with reference to accompanying drawings.

Figure 1:
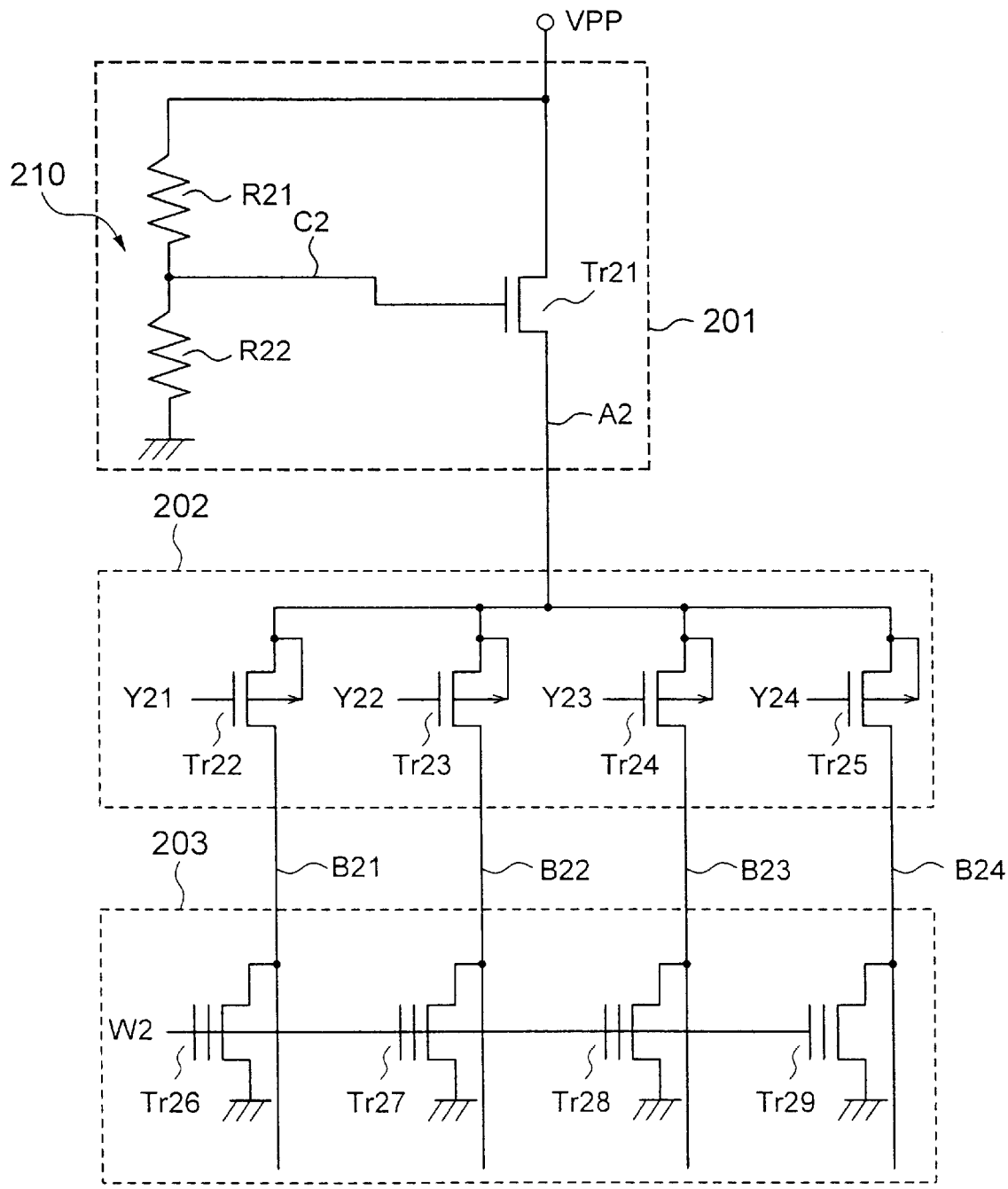
FIG. 1 is a circuit diagram of a conventional flash memory.
Figure 2:
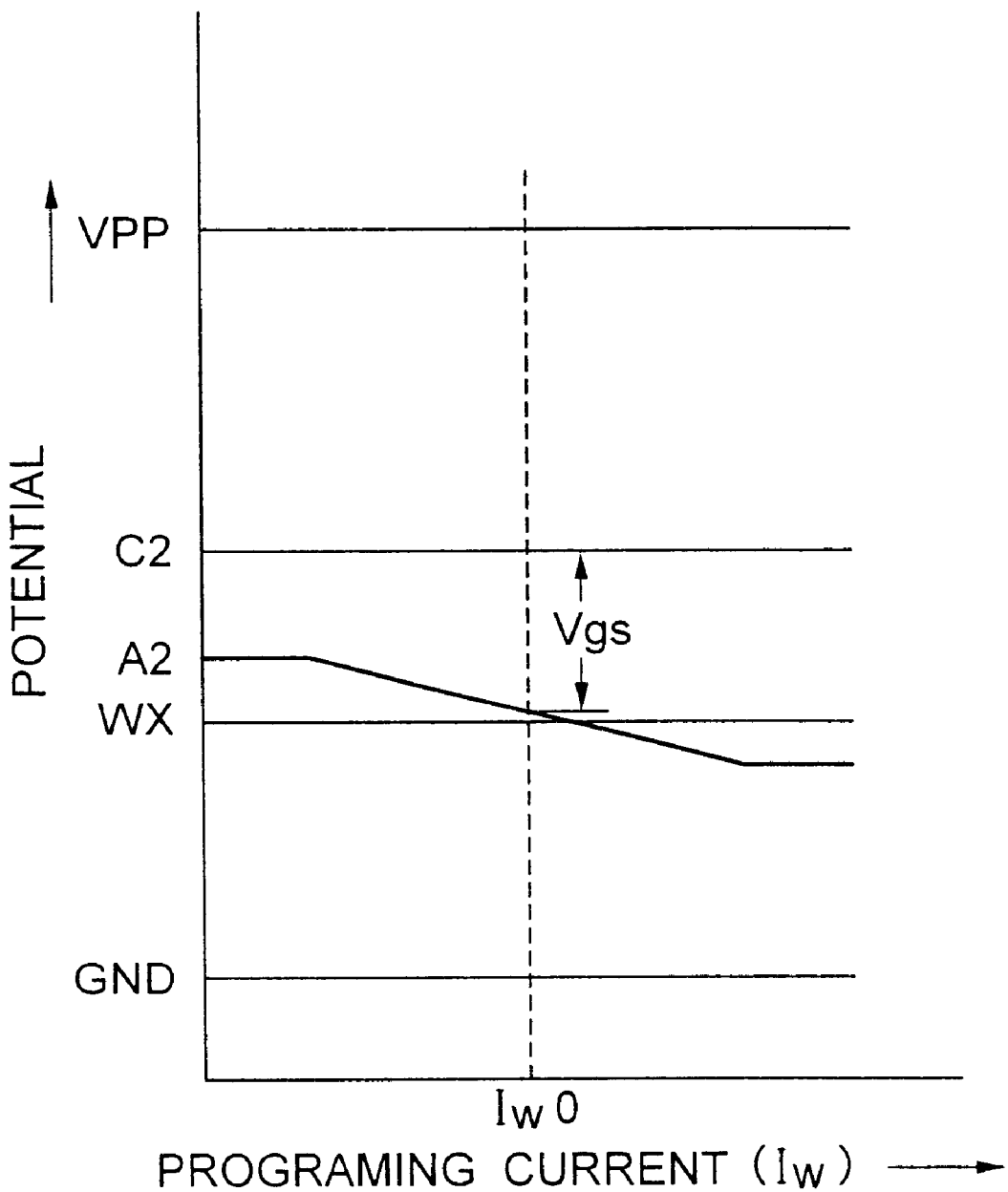
FIG. 2 is a timing chart of potentials of nodes in the flash memory of FIG. 1.
Figure 3:
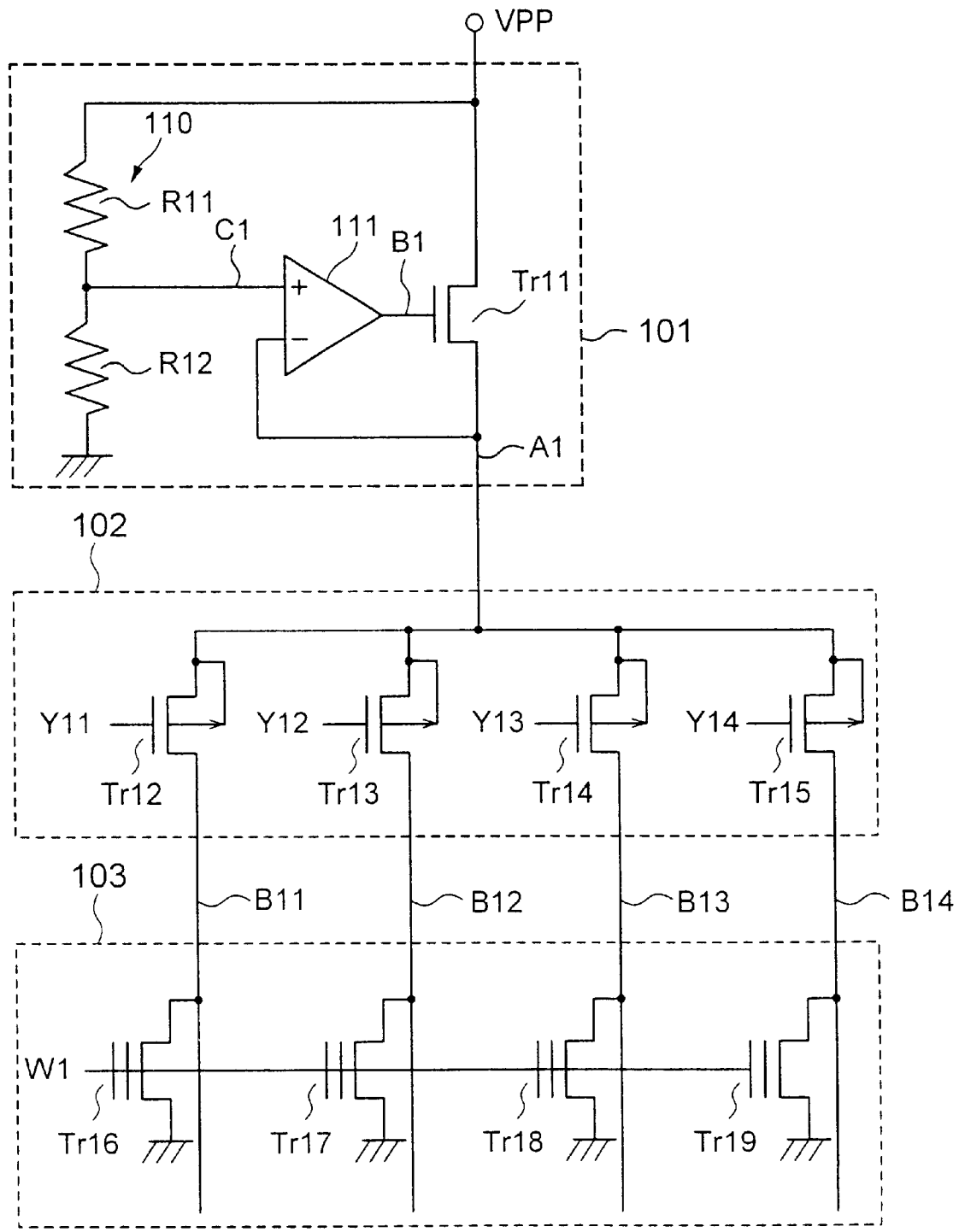
FIG. 3 is a circuit diagram of a flash memory as a nonvolatile semiconductor memory device according to an embodiment of the present invention.

Referring to FIG. 3, a nonvolatile memory device according to an embodiment of the present invention is implemented as a flash memory. The flash memory includes a programming section 101, a memory cell array 103 and a selector section 102.

The programming section 101 includes a voltage divider 110 including resistors R11 and R12 for dividing the source potential VPP, a differential amplifier 111 having a non-inverting input connected to the output node C1 of the voltage divider 110, an undoped n-channel MOSFET Tr11 having a drain connected to the source line VPP, a gate connected to the output node B1 of the differential amplifier 111 and a source connected through a node A1 to the inverting input of the differential amplifier 111 for a feedback loop.

The memory cell array 103 includes a plurality of memory cells arranged in a matrix and each including a cell transistor Tr16 . . . Tr19. The cell transistor Tr16 . . . Tr19 has a source connected to the ground, a drain connected to a corresponding bit line B11 . . . B14, a control gate connected to a corresponding word line W1, and a floating gate for storing data thereon.

The selector section 102 includes a plurality of select transistors Tr12 to Tr15 each implemented as a p-channel transistor corresponding to a bit line B11 . . . B14. Each of the select transistors Tr12 to Tr15 has a source connected through node A1 to the source of the undoped nMOSFET Tr11, a drain connected to a corresponding bit line, and a gate for receiving a corresponding control signal Y11 . . . Y14.

In the flash memory of FIG. 3, the voltage divider 110 divides the source potential VPP to output a reference potential at node C1 to the non-inverting input of the differential amplifier 111. The differential amplifier 111 delivers its output at node B1 to the gate of the undoped nMOSFET Tr12, the source of which is fed-back to the inverting input of the differential amplifier 111 at node A1. Thus, the combination of the differential amplifier 111 and the undoped nMOSFET Tr11 acts as a voltage follower, which renders the potential of node A1 to be substantially equal to the potential of node C1 irrespective of the drain current of the undoped nMOSFET Tr11.

More specifically, If the potential of node A1 falls below the potential of node C1, for example, due to the large programming current flowing through the undoped nMOSFET Tr11, the potential of the output node B1 of the differential amplifier 111 rises to drive the undoped nMOSFET Tr11 to reduce the on-resistance thereof, thereby raising the potential of node A1 until the potential of node A1 becomes equal to the potential of node C1.

Assuming that the undoped nMOSFET Tr11 having a threshold of zero volt operates in a saturated state thereof, the drain current Ids is obtained by:

$$Ids = (1/2)\beta(W/L)Vgs^2$$

wherein $\beta$, W, L and Vgs are constant, gate width, gate length and source-to-gate potential, respectively;

The drain current Ids is set at the maximum current for the programming, whereas $\beta$ is determined by the fabrication process. The source-to-gate potential Vgs is equal to the potential of node B1 minus the potential of node A1, which is set at a desired programming voltage. The potential of node B1 can assume a maximum of source potential VPP, and the controllable range of the differential amplifier 111 for controlling the potential of node A1 at a constant can be obtained between VPP and the desired programming voltage. Thus, W/L or size of the undoped nMOSFET Tr11 can be determined based on the load current or the maximum programming current.

In a programming operation of a cell transistor Tr16, for example, a high voltage is applied to the word line W1, and the gate potential Y11 of pMOSFET Tr12 is set below the potential of node A1 minus the absolute value of the threshold voltage VTP1 of pMOSFET Tr12 to turn on the pMOSFET Tr12, whereby the drain of the cell transistor Tr16 is applied with the programming voltage. Thus, cell transistor Tr16 is turned on to pass the drain current, whereby hot electrons are generated in the vicinity of the drain of the cell transistor Tr16 to be injected into the floating gate of the cell transistor Tr16 for programming. At this stage, although the potential of node A1 is lowered by a product of the on-resistance of undoped nMOSFET Tr11 and the drain current of the cell transistor Tr16, the potential of node A1 resides substantially at the setting voltage due to the function of the differential amplifier 111.

On the other hand, in a programming operation for a row of the cell transistors Tr16 to Tr19 at a time, the potential of word line W1 is set at a high voltage, the potentials Y11 to Y14 of the gate of pMOSFETs Tr12 to Tr15 are set below the potential of node A1 minus the absolute value of the threshold voltage VTP1 of pMOSFETs Tr12 to Tr15 to turn on the pMOSFETs Tr12 to Tr15. Thus, the drains of the cell transistors Tr16 to Tr19 are applied with the programming voltage.

The cell transistors Tr16 to Tr19 are turned on to pass the drain currents, whereby hot electrons are generated in the vicinities of the drains of the cell transistors Tr16 to Tr19 to be injected into the floating gates of the cell transistors Tr16 to Tr19 for programming.

Figure 4:
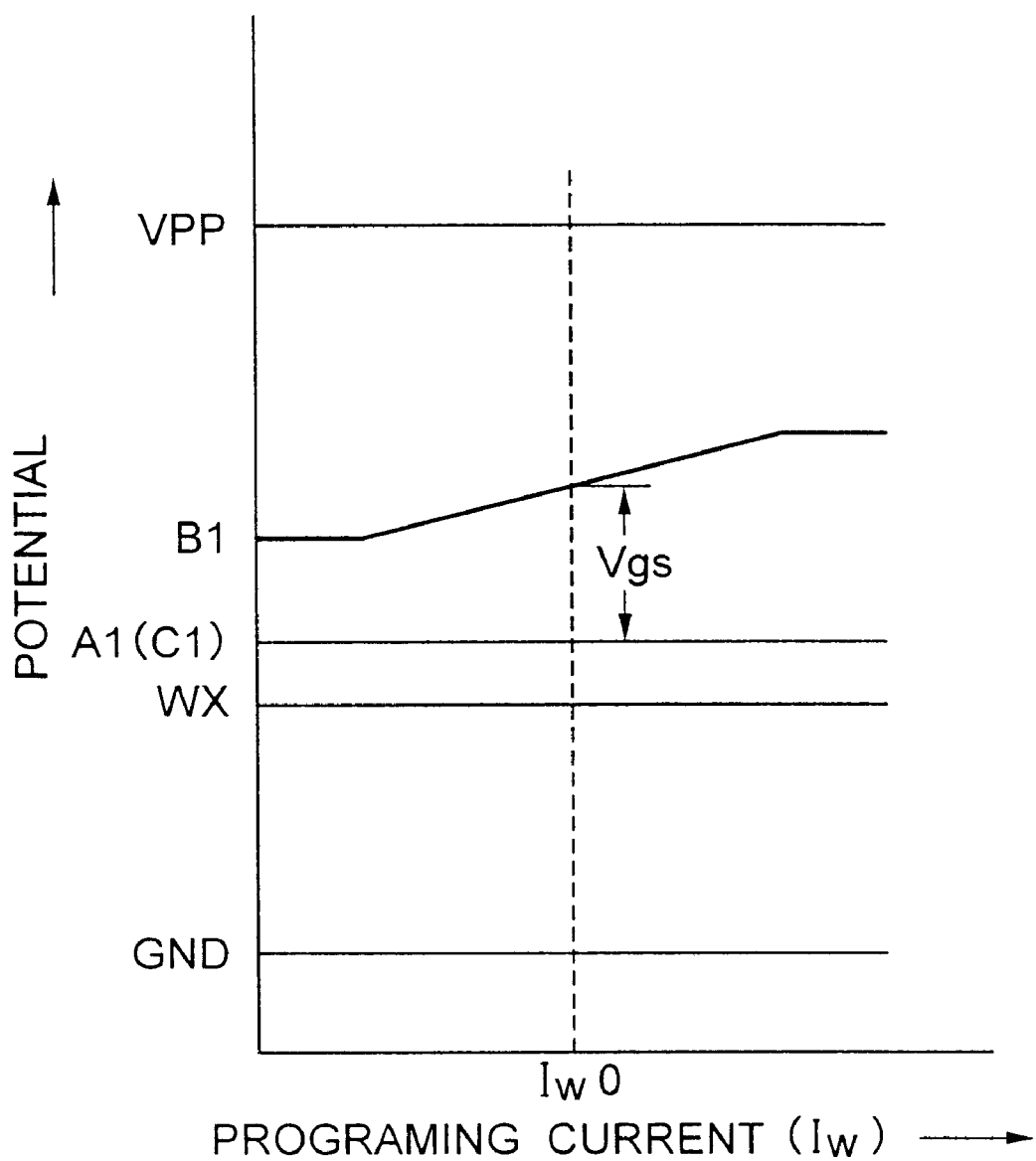
FIG. 4 is a timing chart of potentials of nodes in the flash memory of FIG. 3.

FIG. 4 shows the potential of node A1 at this stage as well as the potentials of other nodes. Although the potential of node A1 is to be lowered by a product of the on-resistance of undoped nMOSFET Tr11 and the sum IWO of the drain currents of the cell transistors Tr16 to Tr19, the differential amplifier 111 raises the potential of node B1 based on the difference between the potential of nodes A1 and the potential of node C1, whereby the potential of node A1 is maintained substantially equal to the potential of node C1.

In short, the potential of node A1 is maintained substantially at a constant irrespective of the drain current of the undoped nMOSFET Tr11, whereby an equal programming speed can be obtained irrespective of the number of the cell transistors being programmed at a time.

The flash memory of the present embodiment is compared against the conventional flash memory for the size of the undoped nMOSFET being required, while assuming that the source potential VPP is 9.6 volts, a desired potential at node A1 (A2) is 5.6 volts and the maximum programming current is 20 mA. In the conventional device, assuming that the allowable range of node A2 is set at 100 mA, node C2 is set at 5.7 volts. Therefore, the expression of the drain current Ids:

$$Ids=(1/2)\beta(W/L)Vgs^2$$

can be replaced by:

$$20mA=(1/2)\beta(W/L)(5.7\ v-5.6\ v)^2$$

Thus, the minimum value for $\beta(W/L)$ is obtained as $\beta(W/L)=4$.

On the other hand, in the present embodiment, the potential of node B1 can assume 9.6 volts. Thus, the expression may be replaced by:

$$20mA=(1/2)\beta(W/L)\ (9.6\ v-5.6\ v)^2$$

Thus, the minimum value for $\beta(W/L)$ is obtained as $\beta(W/L)=0.0025$. Compared to the conventional device, the W/L ratio of the undoped nMOSFET in the present embodiment can be reduced down to 1/1600. It means that the size of the undoped nMOSFET in the present embodiment can be reduced significantly. In addition, it is not necessary to determine the allowable range of the potential of node A1.

Since the above embodiment is described only for examples, the present invention is not limited to the above embodiment and various modifications or alterations can be easily made therefrom by those skilled in the art without departing from the scope of the present invention.

What is claimed is:

1. A nonvolatile semiconductor memory device comprising a memory cell array including an array of nonvolatile memory cells each including a cell transistor, a bit line disposed for each column of said memory cells for supplying source current to said cell transistors of a corresponding column of said memory cells, a word line disposed for each row of said memory cells for activating said cell transistors of a corresponding row of said memory cells, a selector section for selecting one or plurality of said memory cells for programming, and a programming section including a programming transistor having an output node for supplying programming current to said bit lines, said programming section including a differential amplifier acting as a voltage follower in combination with said programming transistor, said differential amplifier having an inverting input connected directly to said output node, said output node assuming a substantially constant potential irrespective of a number of said memory cells being programmed at a time.

2. The nonvolatile semiconductor memory device as defined in claim 1, wherein said differential amplifier has a non-inverting input for receiving a reference voltage, and an output connected to a gate electrode of said programming transistor.

3. The nonvolatile semiconductor memory device as defined in claim 2, wherein said programming transitor is connected between a source line and said output node.

4. The nonvolatile semiconductor memory device as defined in claim 3, wherein said references potential is delivered from a voltage divider which divides a source potential at a specified ratio.

5. The nonvolatile semiconductor memory device as defined in claim 1, wherein said cell transitor includes a floating gate.

* * * * *